(12) United States Patent
Chen et al.

(10) Patent No.: US 6,692,903 B2
(45) Date of Patent: Feb. 17, 2004

(54) SUBSTRATE CLEANING APPARATUS AND METHOD

(75) Inventors: Haojiang Chen, Cupertino, CA (US); James S. Papanu, San Rafael, CA (US); Mark Kawaguchi, San Jose, CA (US); Harald Herchen, Los Altos, CA (US); Jeng H. Hwang, Cupertino, CA (US); Guangxiang Jin, San Jose, CA (US); David Palagashvili, Mountain View, CA (US)

(73) Assignee: Applied Materials, Inc, Santa Clara, CA (US)

( * ) Notice: Subject to any disclaimer, the term of this patent is extended or adjusted under 35 U.S.C. 154(b) by 137 days.

(21) Appl. No.: 09/737,373

(22) Filed: Dec. 13, 2000

(65) Prior Publication Data

US 2002/0072016 A1 Jun. 13, 2002

(51) Int. Cl.[7] ............... G03F 7/36; C03C 15/00; H01L 21/302; C25F 3/02
(52) U.S. Cl. ............ 430/329; 430/323; 216/63; 438/707; 134/1.1; 134/1.3
(58) Field of Search ............... 430/329, 323; 216/63; 438/707; 134/1.1, 1.3

(56) References Cited

U.S. PATENT DOCUMENTS

| | | | |
|---|---|---|---|
| 2,323,369 A | | 7/1943 | Briggman ............ 422/9 |
| 2,972,861 A | | 2/1961 | Davies ............ 60/780 |
| 3,967,926 A | | 7/1976 | Rozenfeld et al. ....... 21/2.5 B |
| 4,226,896 A | * | 10/1980 | Coburn et al. ............ 427/34 |
| 4,325,984 A | | 4/1982 | Galfo et al. ............ 427/534 |
| 4,693,779 A | | 9/1987 | Okuhira et al. ......... 156/345.5 |
| 4,718,974 A | | 1/1988 | Minaee ............ 438/708 |

(List continued on next page.)

FOREIGN PATENT DOCUMENTS

| | | |
|---|---|---|
| CA | 0539707 | 8/1955 |
| CA | 0515917 | 4/1957 |
| EP | 0304046 | 8/1988 |
| EP | 0345757 | 6/1989 |
| EP | 0663690 | 6/1989 |
| EP | 0379301 | 1/1990 |
| EP | 0416774 | 8/1990 |
| EP | 0489179 | 6/1991 |
| GB | 2008464 | 11/1978 |
| JP | 1175231 | 12/1987 |
| JP | 63070428 | 3/1988 |
| JP | 1112734 | 1/1989 |
| JP | 6448421 | 2/1989 |
| JP | 0341728 | 7/1989 |
| JP | 1227160 | 9/1989 |
| JP | 4171918 | 11/1990 |

OTHER PUBLICATIONS

Battey, James F., "The reduction of Photoresist Stripping Rates in an Oxygen Plasma by By–Product Inhibition and Thermal Mass". *J. Electrochem. Soc.: Solid–State Science and Technology*, 124(1): 147–152 (Jan. 1977).

(List continued on next page.)

*Primary Examiner*—Mark F. Huff
*Assistant Examiner*—Nicole Barreca
(74) *Attorney, Agent, or Firm*—Ashok K. Janah; Joseph Bach

(57) ABSTRACT

A method of processing a substrate 30 comprises exposing the substrate 30 to an energized process gas to etch features 67 on the substrate 30 and exposing the substrate 30 to an energized cleaning gas to remove etchant residue 70 and/or remnant resist 60 from the substrate 30. To enhance the cleaning process, the substrate 30 may be treated before, during or after the cleaning process by exposing the substrate 30 to an energized treating gas comprising a halogen species.

49 Claims, 7 Drawing Sheets

U.S. PATENT DOCUMENTS

| | | | | |
|---|---|---|---|---|
| 4,749,440 | A | 6/1988 | Blackwood et al. | 438/706 |
| RE32,928 | E | 5/1989 | Jacob | 438/725 |
| 4,863,561 | A | 9/1989 | Freeman et al. | 134/1.2 |
| 4,877,757 | A | 10/1989 | York et al. | 438/767 |
| 4,911,812 | A | 3/1990 | Kudo et al. | 204/192.32 |
| 4,961,820 | A | 10/1990 | Shinagawa et al. | 438/725 |
| 4,983,254 | A | 1/1991 | Fujimura et al. | 216/67 |
| 5,007,981 | A | 4/1991 | Kawasaki et al. | 134/1.2 |
| 5,024,748 | A | 6/1991 | Fujimura | 204/298.38 |
| 5,039,376 | A | 8/1991 | Zukotynski | 216/71 |
| 5,102,496 | A | 4/1992 | Savas | 216/69 |
| 5,134,089 | A | 7/1992 | Barden et al. | 438/443 |
| 5,160,407 | A | 11/1992 | Latchford et al. | 438/714 |
| 5,174,856 | A | 12/1992 | Hwang et al. | 216/69 |
| 5,183,775 | A * | 2/1993 | Levy | 437/60 |
| 5,198,634 | A | 3/1993 | Mattson et al. | 219/121.43 |
| 5,200,031 | A | 4/1993 | Latchford et al. | 216/13 |
| 5,221,424 | A | 6/1993 | Rhoades | 216/13 |
| 5,221,425 | A | 6/1993 | Blanchard et al. | 216/66 |
| 5,228,950 | A | 7/1993 | Webb et al. | 438/714 |
| 5,240,555 | A | 8/1993 | Kilburn et al. | 216/67 |
| 5,262,279 | A | 11/1993 | Tsang et al. | 430/311 |
| 5,280,359 | A | 1/1994 | Mimura et al. | 348/230 |
| 5,298,112 | A | 3/1994 | Hayasaka et al. | 216/67 |
| 5,306,671 | A | 4/1994 | Ogawa et al. | 438/595 |
| 5,328,555 | A | 7/1994 | Gupta | 134/1.2 |
| 5,348,619 | A | 9/1994 | Bohannon et al. | 438/734 |
| 5,356,478 | A | 10/1994 | Chen et al. | 134/1 |
| 5,378,311 | A | 1/1995 | Nagayama et al. | 438/16 |
| 5,382,316 | A | 1/1995 | Hills et al. | 216/67 |
| 5,384,009 | A | 1/1995 | Mak et al. | 438/696 |
| 5,397,432 | A | 3/1995 | Konno et al. | 438/714 |
| 5,399,236 | A | 3/1995 | Ha et al. | 438/720 |
| 5,403,436 | A | 4/1995 | Fujimura et al. | 216/69 |
| 5,413,950 | A | 5/1995 | Chen et al. | 438/253 |
| 5,413,954 | A | 5/1995 | Aydil et al. | 117/97 |
| 5,417,826 | A | 5/1995 | Blalock | 204/176 |
| 5,425,843 | A | 6/1995 | Saul et al. | 438/694 |
| 5,449,411 | A | 9/1995 | Fukuda et al. | 118/723 MP |
| 5,451,293 | A | 9/1995 | Tabara | 438/669 |
| 5,460,999 | A | 10/1995 | Hong et al. | 437/47 |
| 5,468,686 | A | 11/1995 | Kawamoto | 438/714 |
| 5,478,403 | A | 12/1995 | Shinagawa et al. | 134/1.1 |
| 5,514,247 | A | 5/1996 | Shan et al. | 438/700 |
| 5,545,289 | A | 8/1996 | Chen et al. | 438/694 |
| 5,560,803 | A | 10/1996 | Mihara et al. | 438/725 |
| 5,578,163 | A | 11/1996 | Yachi | 438/696 |
| 5,620,559 | A | 4/1997 | Kikuchi | 438/723 |
| 5,628,871 | A | 5/1997 | Shinagawa | 438/514 |
| 5,674,357 | A | 10/1997 | Sun et al. | 134/1.2 |
| 5,681,780 | A | 10/1997 | Mihara et al. | 438/700 |
| 5,693,147 | A | 12/1997 | Ward et al. | 134/1.1 |
| 5,773,201 | A | 6/1998 | Fujimura et al. | 430/329 |
| 5,780,359 | A | 7/1998 | Brown et al. | 438/659 |
| 5,814,155 | A | 9/1998 | Solis et al. | 134/1 |
| 5,814,563 | A * | 9/1998 | Ding et al. | 438/714 |
| 5,824,604 | A | 10/1998 | Bar-Gadda | 438/725 |
| 5,849,639 | A | 12/1998 | Molloy et al. | 438/714 |
| 5,858,878 | A | 1/1999 | Toda | 438/9 |
| 5,968,275 | A | 10/1999 | Lee et al. | 118/723 R |
| 5,980,768 | A | 11/1999 | Abraham | 216/67 |
| 6,006,764 | A * | 12/1999 | Chu et al. | 134/1.2 |
| 6,008,128 | A * | 12/1999 | Habuka et al. | 438/695 |
| 6,235,645 | B1 * | 5/2001 | Habuka et al. | 438/758 |

OTHER PUBLICATIONS

Eldredge, G., et al., "Inhibitors of Corrosion of Aluminum," *Industrial and Engineering Chemistry*, 37(8): 736–740 (Aug. 1945).

Fok, T., "Plasma Etching of Aluminum Films Using $CCl_4$," *Electrochemical Soc. Ext. Abstract*, May 1980, pp. 301–303.

Fujimura, S., et al., "Resist Stripping in an $O_2+H_2O$ Plasma Downstream." *J. Vac. Sci. Technol. B.*, 9(2):357–361 (Mar./Apr. 1991).

Fujimura, S., et al., "Additive Nitrogen Effects on Oxygen Plasma Downstream Ashing," *Japanese Journal of Applied Physics*, 29(10):2165–2170, Part 1, (Oct. 1990).

Gas Plasma Systems Bulletin No. 73/79 entitled, "DIONEX™ Stripping Wafers with Plasma" (4 pages).

Kondo, T., et al., "Effects of $H_2O$ Downstream on After Corrosion," *1991 Dry Process Symposium*, pp. 117–122.

Mayumi, S., et al., "Post–Treatments for Reactive Ion Etching of Al–Si–Cu Alloys," *Journal of the Electrochemical Society*, 137 (8): 2534–2538 (Aug. 1990).

Nebergall, W., et al., "College Chemistry with Qualitative Analysis," *D.C. Health and Company*, 6th Ed. (1980), p. 119.

Pender, et al., "CD Control and Residue Removal During Wafer Stripping After Dielectric Etches", Abstract from 196th Electrochemical Society Meeting, Oct. 22, 1999.

Roebuck, A., et al., "Corrosion Inhibitors for Aluminum," *Materials Protection*, pp. 16–19 (Jul. 1966).

Rosenfeld, I., et al., "Mechanism of Metal Protection by Volatile Inhibitors," *Corrosion*, 20(7): 222t–234t (Jul. 1964).

Wranglin, G., "An Introduction to Corrosion and Protection of Metals," *Chapman and Hall* (1985), pp. 165–169.

Chang, et al., "Anhydrous HF etch reduces processing steps for DRAM capacitors," *Solid State Technology*, pp. 71–76, May 1998.

* cited by examiner

SUBSTRATE CLEANING APPARATUS AND METHOD

BACKGROUND

The present invention relates to cleaning a substrate.

In the manufacture of integrated circuits, active and passive devices are formed on a substrate, such as a semiconductor wafer, by alternately depositing and etching layers of dielectric, semiconducting, and conducting materials, such as silicon dioxide, polysilicon, and metal compounds and alloys. These layers may be etched to form a pattern of etched features by providing a resist layer of photoresist and/or oxide hard mask on the substrate, and using lithography or energized gas to expose and pattern the resist layer. The portions of the layers adjacent to the patterned resist features are etched to form a predefined pattern of gates, vias, contact holes, trenches, and/or metal interconnect lines. Etching is typically performed using a capacitively or inductively coupled plasma of halogen-containing gases, as for example described in *Silicon Processing for the VLSI Era, Vol. 1*, Chapter 16, by Wolf and Tauber, Lattice Press, 1986, which is incorporated herein by reference.

The etching process may leave remnant resist and etchant residue on the substrate. Remnant resist are those residual resist portions that are not etched by the etchant gases, and which remain on the substrate after the etching process. The etchant residue may comprise residual species and/or sidewall deposits on the sidewalls of the etched features. The residual species may result from adsorption of halogen-containing etchants on the etched features which may lead to corrosion of the metal-containing features. The sidewall deposits may be formed during the etching process by reaction of the etchant gases, the metal-containing layers, and the resist, and by condensation of the reaction residue on the sidewalls of the features. One method of cleaning an etched substrate is a dry cleaning method in which a plasma of a gas is used to remove remnant resist remaining on the substrate in a stripping (or ashing) process and to remove or inactivate residual halogen-containing species in a passivating process. The sidewall deposits on the substrate are typically removed by wet chemical etching methods or they can be at least partially removed in a dry cleaning process.

Conventional stripping methods which use a plasma of oxygen, nitrogen or water vapor, can be used to strip remnant resist from the substrate. These conventional stripping techniques are sometimes ineffective at stripping all the resist from the substrate, particularly when the polymeric resist is hardened by exposure to a plasma. For oxide hard mask resists, the oxide layer can be stripped or can be left on the substrate. Typically, remnant oxide hard mask is left on the substrate and a dielectric layer is deposited on the remnant oxide in a subsequent process step. In addition, adequate stripping processes generally compromise process throughput. The stripping process may also harden sidewall deposits making the deposits difficult to remove.

In passivating techniques, the etchant residue on the substrate is removed or inactivated to, for example, reduce post-etch corrosion problems by using a passivating gas, such as ammonia and/or water vapor. One limitation of conventional passivating techniques is that they often only prevent post-etch corrosion of the substrate for short periods, typically ranging from about 1 to 5 hours after exposure of the substrate to ambient moisture. The short corrosion resistant period is undesirable because post-etch processing steps may need to be performed within 1 to 2 hours after the substrate is first exposed to the atmosphere, resulting in a tight or inflexible production schedule. Often, the substrate cannot be etched, or if already etched, cannot be removed from the chamber in order to avoid corrosion.

Due to the shortcomings of the conventional dry cleaning processes, remnant resist and/or etchant residues are often removed in a wet-cleaning process in which the substrate is exposed to wet solvents. However, the wet-cleaning process also suffers from several disadvantages. For example, residue removal is often not complete, resulting in inconsistently processed substrates. In addition, the solvents may attack the metal-containing features on the substrate, particularly when very small features are etched on the substrate. The solvents used may also be costly and may generate hazardous chemical waste that is difficult to dispose of.

Thus, there is a need for a process and apparatus for cleaning a substrate to, for example, remove remnant resist and etchant residue on the substrate. It is further desirable to reduce post-etch corrosion. It is still further desirable to be able to clean a substrate while reducing the need to expose the substrate to a wet solvent.

SUMMARY

The present invention satisfies these needs. In one aspect of the present invention, a substrate processing method comprises exposing a substrate to an energized process gas to etch the substrate, exposing the substrate to an energized cleaning gas, and before, during, or after exposing the substrate to an energized cleaning gas, exposing the substrate to an energized treating gas comprising a halogen species and a hydrogen species.

In another aspect of the invention, a substrate processing method comprises exposing a substrate to an energized process gas to etch the substrate and exposing the substrate to an energized treating gas comprising a chlorine species.

In another aspect of the invention, a substrate processing method comprises exposing a substrate to an energized process gas to etch the substrate and exposing the substrate to an energized treating gas comprising a fluorine species and a hydrogen species.

In another aspect of the invention, a method of treating an etched substrate comprises exposing the etched substrate to an energized process gas comprising a first halogen species and exposing the etched substrate to an energized process gas comprising a second halogen species.

In another aspect of the invention, a method of cleaning an etched substrate comprises exposing a substrate to a cleaning gas; and after this, exposing the substrate to an energized treating gas comprising one or more of $NH_3$ and $H_2$.

In another aspect of the invention, a substrate processing method comprises exposing a substrate to an energized process gas to etch the substrate in a process zone and exposing the substrate to an energized treating in the process zone.

In another aspect of the invention, a method of treating an etched substrate comprises exposing the etched substrate to an energized process gas comprising oxygen species while maintaining the substrate at a temperature of at least about 200° C., treating the substrate with a treating gas and rinsing the substrate with de-ionized water to remove etchant residue on the substrate.

DRAWINGS

These features, aspects, and advantages of the present invention will become better understood with regard to the following description, appended claims, and accompanying drawings which illustrate examples of the invention. However, it should be understood that each of the features can be used in the invention in general, not merely in the context of the particular drawings, and the invention includes any combination of these features, where:

DESCRIPTION

The process and apparatus of the present invention are useful for processing substrates, such as semiconductor wafers, but may also be used for other processes or for processing other substrates, such as printed circuit boards, flat panel displays, and liquid crystal displays. Thus, the description represents illustrative embodiments of the invention and is not intended to limit the invention.

Figure 1A:
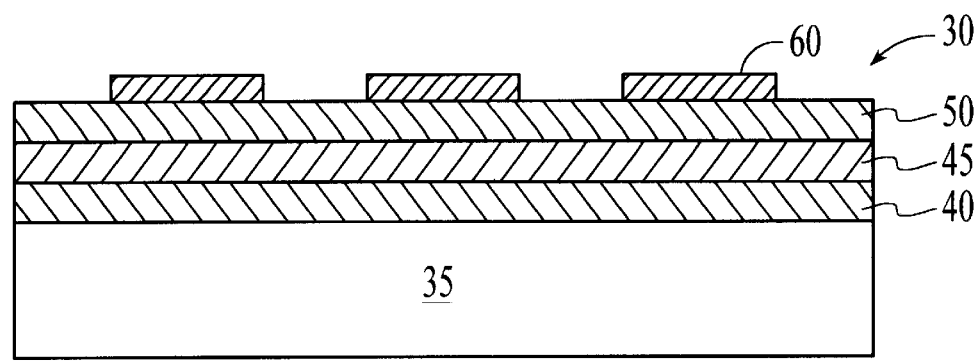
FIG. 1a is a schematic sectional side view of a substrate with metal-containing layers thereon.

In one version of the present invention, a substrate 30, such as a substratum 35 having one or more materials, such as layers 40, 45, 50, thereon as shown in FIG. 1a, may be processed. These layers are often superimposed on one another and may comprise dielectric layers comprising, for example, silicon dioxide, undoped silicate glass, phosphosilicate glass (PSG), borophosphosilicate glass (BPSG), $Si_3N_4$, or TEOS deposited glass; semiconducting layers comprising, for example, silicon-containing layers such as polysilicon or a silicon compound; and electrically conducting layers such as metal-containing layers comprising, for example, aluminum, copper, titanium, titanium nitride, or metal silicide such as tungsten silicide and cobalt silicide. Suitable etchant gases for etching layers on the substrate 30, include for example, HCl, $BCl_3$, HBr, $Br_2$, $Cl_2$, $CCl_4$, $SiCl_4$, $SF_6$, $F_2$, $NF_3$, HF, $CF_3$, $CF_4$, $CH_3F$, $CHF_3$, $C_2H_2F_2$, $C_2H_2F_4$, $C_2H_4F_2$, $C_2F_6$, $C_3F_8$, $C_4F_8$, $C_2HF_5$, $C_4F_{10}$, $CF_2Cl_2$, $CFCl_3$, $O_2$, $N_2$, He, and mixtures thereof. The etchant gas is selected to provide high etch rates, and highly selective etching of the particular layers or materials that are being etched. When multiple layers are sequentially etched, multiple etchant gas compositions having first, second, third, etc. compositions may be sequentially introduced into the chamber to etch each particular layer.

Figure 1B:
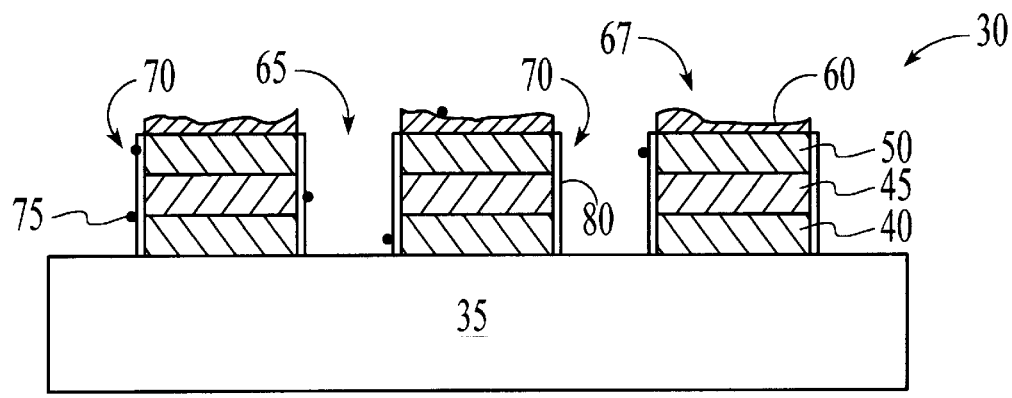
FIG. 1b is a schematic sectional view of the substrate of FIG. 1a following etching.

FIG. 1a shows a version of a substrate 30 having material formed on a substratum 35. The substratum 35 may comprise semiconducting material, such as silicon, gallium arsenide, and the like. The material on the substratum 35 may comprise (i) a diffusion barrier material 40 comprising, for example, silicon oxynitride, organic anti-reflective layer (ARC), titanium, tungsten, titanium-tungsten, or titanium nitride, (ii) an electrically conductive material 45 comprising, for example, titanium, tungsten, aluminum, copper or similar metal or alloys thereof, and optionally silicon, and (iii) an anti-reflective material 50 comprising, for example, silicon, titanium nitride, or titanium tungsten. An oxide layer (not shown), such as $SiO_2$, may also be provided below the diffusion barrier layer 40. A patterned etch-resistant material 60 of, for example, photoresist, such as polymeric photoresist, or electron-beam resist overlies the layers. Etchant gas may be provided to etch the exposed portions of the layers to form apertures 65, such as lines, trenches, holes or vias, that extend through one or more of the layers and which form features 67 on the substrate 30, as schematically illustrated in FIG. 1b.

After the etching process, remnant resist 60 and etchant residue 70 remaining on the substrate 30 may be removed in one or more cleaning processes to provide a clean substrate surface for subsequent processing that is substantially resistant to corrosion. The remnant resist 60 is the portion of the resist material that remains on the substrate 30 after the etching process and may comprise any material that is relatively resistant to etchant gas used to etch one or more underlying materials on the substrate 30. In one version, the remnant resist 60 comprises residual polymeric photoresist or oxide hard mask. Suitable polymeric photoresist materials are commercially available from Shipley Co., Marlboro, Mass., or Tokyo Ohka Kogyo (TOK) Co., Ltd., Kawasaki, Japan. The etchant residue 70 on the features may comprise (i) residual species 75, for example residual halogen radicals, such as chlorine or fluorine, metal containing species, such as one or more metal oxides, or byproduct compounds that are formed when residual halogen radicals react with the metal in the etched layers that remain on the substrate 30 after etching, and/or (ii) sidewall deposits 80 which are formed on the sidewalls of the etched features 67 during etching. The sidewall deposits may comprise (i) organic compounds containing carbon and hydrogen, (ii) metal from the metal-containing layers, such as aluminum or titanium, and (iii) etchant gas species such as chlorine, boron and/or nitrogen. The composition and stoichiometry of the sidewall deposits 80 depend upon the chemical composition of the material being etched, the resist material 60, and the etchant gases used to etch the features 67. In one version, the etchant residue 70 comprises both residual species 75 and sidewall deposits 80. The residual species may comprise one or more of $Al_2O_3$, $TiO_2$, CuO, and $SiO_2$. The sidewall deposits may comprise one or more of carbon, hydrogen, nitrogen, one or more halogens, oxygen, silicon, and metals. By "cleaning" it is meant that one or more of the remnant resist, residual species, and sidewall deposits is at least partially removed from a substrate 30 or inactivated.

Figure 2:
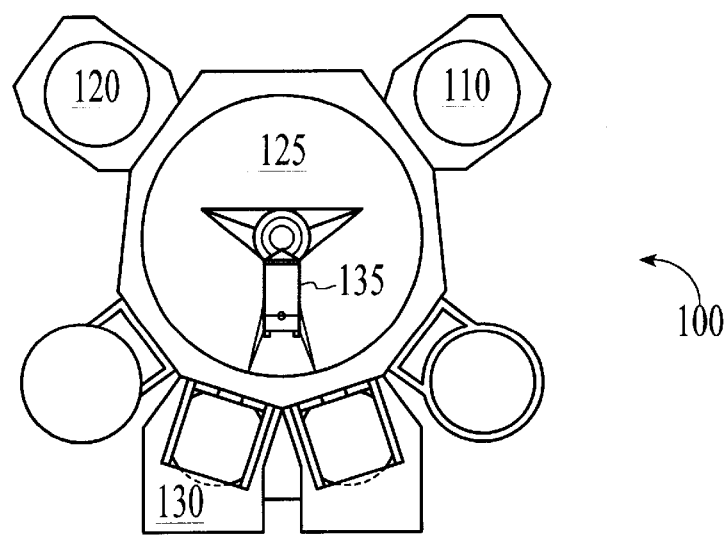
FIG. 2 is a schematic view of a multi-chamber apparatus having an etching chamber and a cleaning chamber.

Referring to FIG. 2, the substrate 30 may be etched and cleaned in a multi-chamber apparatus 100 comprising one or more etching chambers 110 for etching the substrate 30, and one or more cleaning chambers 120 for removing remnant resist 60 and/or removing or inactivating etchant residue 70 that remain on the substrate 30 after the etching process. The etching chamber 110, cleaning chamber 120, a transfer chamber 125, and a load lock chamber 130 may be interconnected in a vacuum sealed environment that may be maintained at a low pressure to reduce contamination of the substrate 30. During processing, a robotic arm 135 transfers a substrate 30 from the load lock chamber 130 to the transfer chamber 125 and then to one of the processing chambers.

Figure 3:
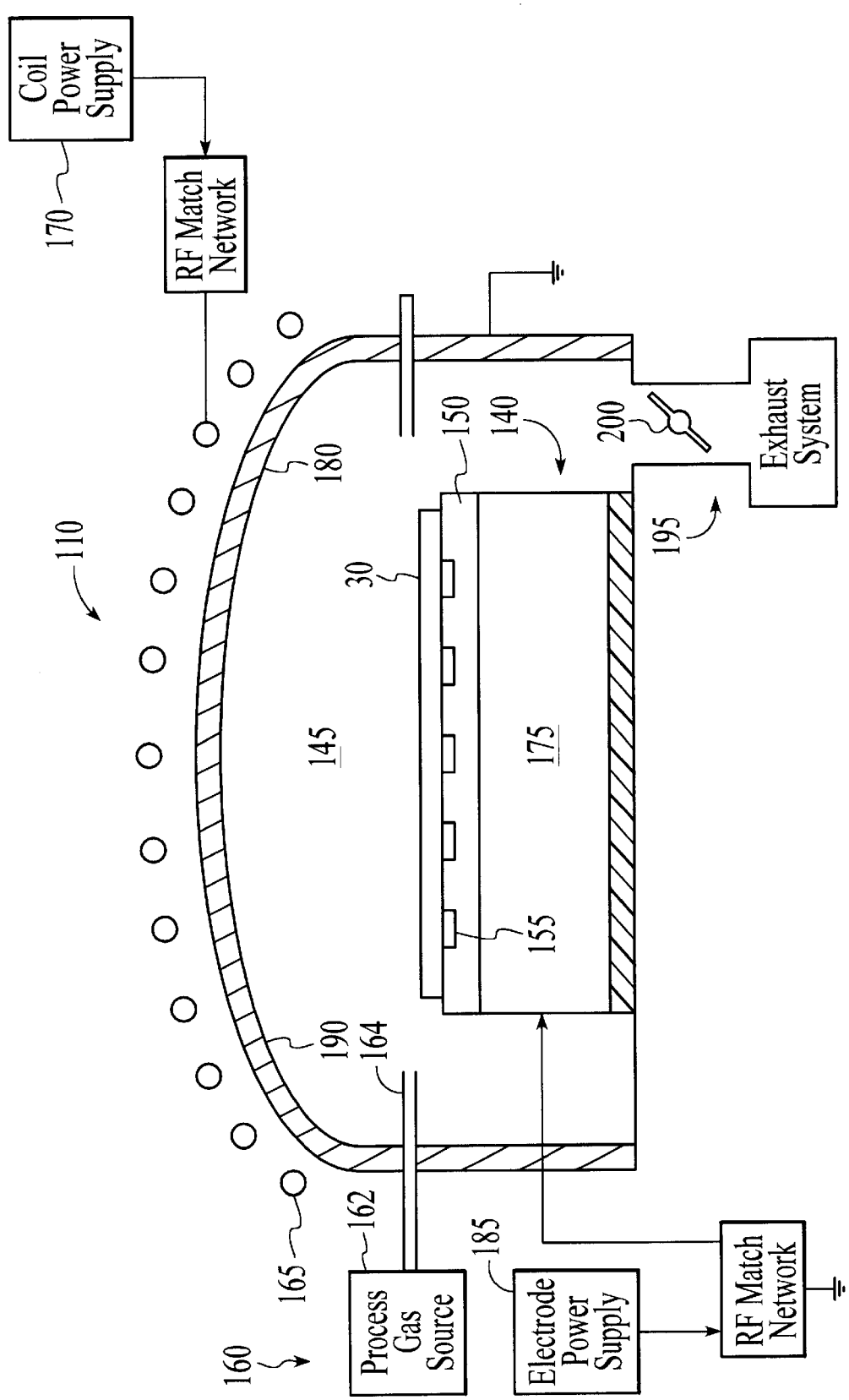
FIG. 3 is a schematic sectional side view of an etching chamber.

The substrate 30 may be etched in a process chamber 110, such as for example, a DPS type Metal Etch Centura chamber, schematically illustrated in FIG. 3, and from Applied Materials, Inc. in Santa Clara, Calif. The particular embodiment of the process chamber 110 shown herein is provided only to illustrate the invention, and should not be used to limit the scope of the invention. The chamber 110 comprises a support 140 within a process zone 145 in the chamber 110. A substrate 30 may be positioned on the support 140 by the robotic arm 135. The substrate 30 may be held in place during the etching process using a mechanical or electrostatic chuck 150 with grooves 155 in which a coolant gas, such as helium, is held to control the temperature of the substrate 30.

During processing of the substrate, the chamber 110 may be maintained at a low pressure and process gas may be introduced into the chamber 110 through a gas supply 160 having a gas source 162 and gas inlets 164 peripherally disposed about the substrate 30. Alternatively, a showerhead gas distributer (not shown) may be positioned above the substrate 30. The process gas may be energized by a gas energizer that couples an energetic electromagnetic field into the process zone 145, such as an inductive, capacitive, or microwave field. In the version shown in FIG. 3, an inductor coil 165 adjacent to the process chamber 110 forms an inductive electric field in the chamber 110 when powered by a coil power supply 170 operated using, for example, an RF voltage at a source power level that may be from about 200 Watts to about 2000 Watts. Alternatively or additionally, a capacitive electric field may be formed in the chamber 110. At least a portion of the support 140 may be electrically conductive to serve as a cathode electrode 175. The cathode electrode 175, in conjunction with sidewalls of the chamber 110 which may be electrically grounded to serve as an anode electrode 180, form process electrodes in the process zone 145 that may capacitively couple to energize the process gas. The cathode 175 may be powered by an electrode power supply 185 operated using, for example, an RF voltage at a power level of from about 10 Watts to about 1000 Watts. The capacitive electric field is substantially perpendicular to the plane of the substrate 30, and may accelerate the plasma species toward the substrate 30 to provide more vertically oriented anisotropic etching of the substrate. The frequency of the RF voltage applied to the process electrodes 175, 180, and/or the inductor coil 165 is typically from about 50 KHz to about 60 MHz, and more typically about 13.56 MHz. In one version, the cathode 175 is also an electrode in a dielectric in the electrostatic chuck 150.

The ceiling 190 of the process chamber 110 can be flat or rectangular shaped, arcuate, conical, dome-shaped, or multi-radius dome-shaped. In one version, the inductor coil 165 covers at least a portion of the ceiling 190 of the process chamber 110 in the form of a multi-radius dome-shaped inductor coil having a "flattened" dome shape that provides more efficient use of plasma source power and increased plasma ion flux uniformity directly over the substrate 30 center.

When capacitively generated, the plasma formed in the process zone 145 may also be enhanced using magnetically enhanced reactors (not shown), in which a magnetic field generator, such as a permanent magnet or electromagnetic coils, are used to apply a magnetic field in the process zone 145 to increase the density and uniformity of the plasma. The magnetic field may comprise a rotating magnetic field with the axis of the field rotating parallel to the plane of the substrate 30, as described in U.S. Pat. No. 4,842,683, which is incorporated herein by reference in its entirety.

Spent process gas and etchant residue are exhausted from the process chamber 110 through an exhaust system 195 capable of achieving a low pressure in the process chamber 110. A throttle valve 200 is provided in the exhaust for controlling the pressure in the chamber 110. Also, an optical endpoint measurement system (not shown) may be used to determine completion of the etching process for a specific layer by measuring, for example, the change in light emission of a particular wavelength corresponding to a detectable gaseous species or by other interferometric techniques.

To perform an etching process in the process chamber 110, an energized process gas comprising etchant gas may be provided in the process zone 145. By "energized process gas" it is meant that the process gas is activated or energized to form one or more dissociated species, non-dissociated species, ionic species, and neutral species. The etchant gas composition may be selected to provide high etch rates, and highly selective etching of a particular layer or layers that are being etched. When etching a metal-containing material, such as conductive material 45, the etchant gases may comprise one or more of halogen-containing gases, such as one or more of $Cl_2$, $BCl_3$, $CCl_4$, $SiCl_4$, $CF_4$, $NF_3$, $SF_6$, $Br_2$, HBr, $BBr_3$, $CHF_3$, C2F2, and the like, and optionally, one or more additive gases, such as inert or non-reactive gases, such as $H_2$, $N_2$, $O_2$, He—$O_2$, and the like. In an exemplary process, the anti-reflective material 50 is etched by exposing the substrate 30 to an energized process gas comprising etchant gas comprising, for example, about 90 sccm $Cl_2$ and about 30 sccm $BCl_3$ at a pressure of about 8 mTorr, a source power level of about 1600 Watts, a bias power level of about 145 Watts, a backside helium pressure of about 4 Torr and a cathode temperature of about 50° C. The electrically conductive material 45 may then be etched by an energized process gas comprising etchant gas comprising, for example, about 80 sccm $Cl_2$, about 5 sccm $BCl_3$, and about 10 sccm $CHF_3$ at a pressure of about 14 mTorr, a source power level of about 1600 Watts, a bias power level of about 150 Watts, a backside helium pressure of about 8 Torr and a cathode temperature of about 50° C. Thereafter, the diffusion barrier layer 40, and optionally a portion of the oxide layer, may be etched by introducing an energized process gas comprising etchant gas comprising, for example, about 30 sccm $Cl_2$, about 5 sccm $BCl_2$, and about 30 sccm $N_2$ or Ar at a pressure of about 10 mTorr, a source power level of about 1600 Watts, a bias power level of about 125 Watts, a backside helium pressure of about 8 Torr and a cathode temperature of about 50° C.

After completion of the etching process, the substrate 30 may be dechucked and lifted from the support 140 by, for example, a pneumatic lifting apparatus which raises lift pins (not shown) in the support 140 to raise the substrate 30 from the surface of the support 140. The robotic transport arm 135 may be inserted between the substrate 30 and the support 140 to lift the substrate 30 off the lift pins. Thereafter, the lift pins are retracted into the support 140, and the robotic arm 135 transports the substrate 30 out of the etching chamber 110 and into the transfer chamber 125.

Figure 4:
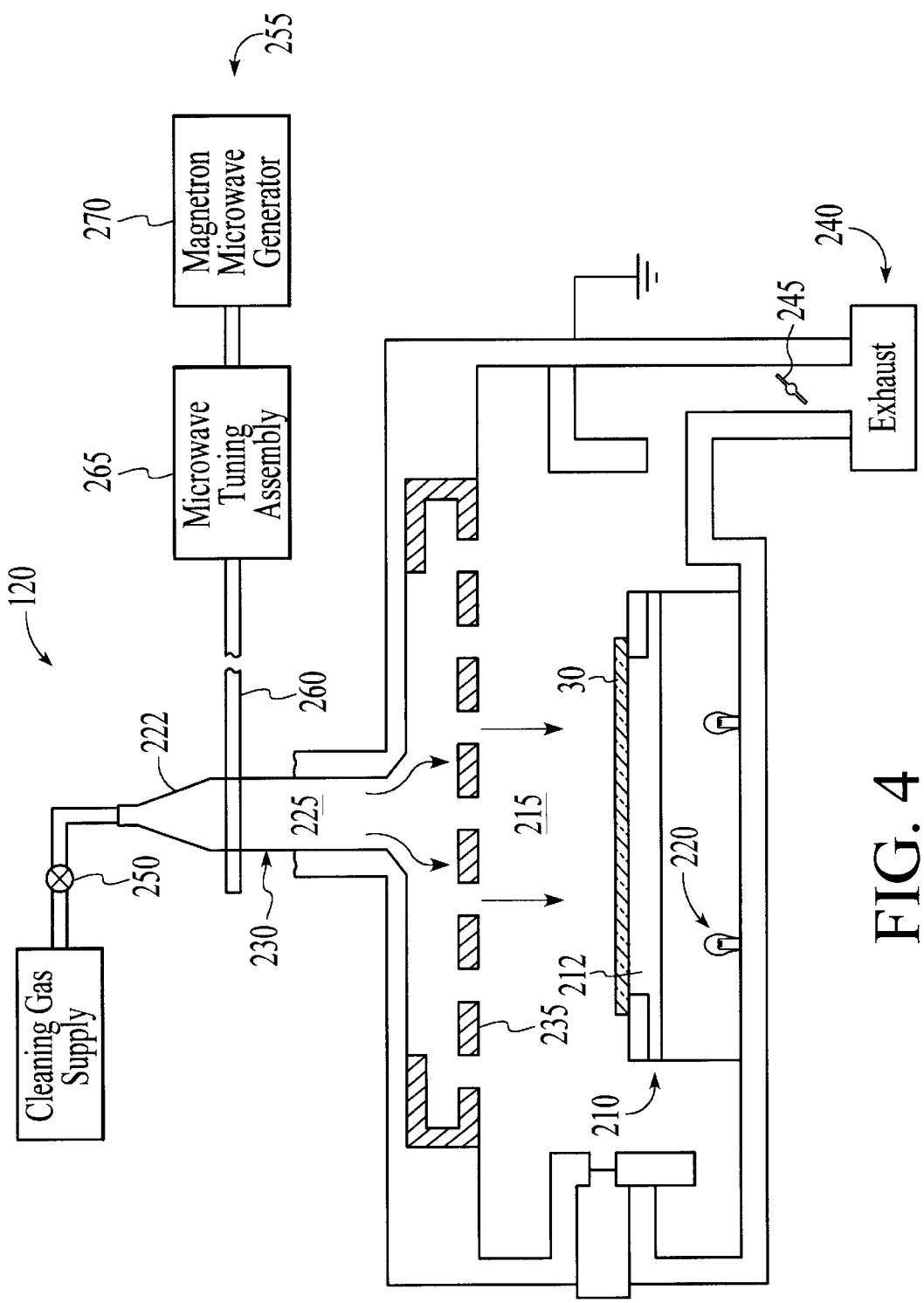
FIG. 4 is a schematic sectional side view of a cleaning chamber.

To remove the etchant residue 70 and remnant resist 60, the substrate 30 may be transferred from the transfer chamber 125 to a cleaning chamber 120, such as for example, an Advanced Strip and Passivation, (ASP) chamber, schematically illustrated in FIG. 4, and commercially available from Applied Materials Inc. in Santa Clara, Calif. The cleaning chamber 120 shown herein is provided only to illustrate the process of the present invention, and should not be used to limit the scope of the invention, because other cleaning chambers can also be used to clean the substrate 30, including the process chamber 110 shown in FIG. 3. The substrate 30 is placed on a support 210 by the robotic arm 135, and optionally held in place during processing by a mechanical or electrostatic chuck 212.

In the cleaning chamber 120 of the type illustrated in FIG. 4, an energized process gas comprising cleaning gas is provided to clean the substrate 30 held on the support 210 in a process zone 215. The support 210 supports the substrate 30 in the process zone 215 and may optionally comprise an electrostatic chuck 212. Within or below the support 210, a heat source, such as infrared lamps 220, can be used to heat the substrate 30. The process gas comprising cleaning gas may be introduced through a gas distributor 222 into a remote plasma generation zone 225 in a remote chamber 230. By "remote" it is meant that the center of the remote chamber 230 is at a fixed upstream distance from the center of a process zone 215 in the cleaning chamber 120. In the remote chamber 230, the cleaning gas is activated by coupling microwave or RF energy into the remote chamber 230, to energize the cleaning gas and cause ionization or dissociation of the cleaning gas components, prior to its introduction through a diffuser 235, such as a showerhead diffuser, into the process zone 215. Alternatively, the process gas may be energized in the process zone 215. Spent cleaning gas and residue may be exhausted from the cleaning chamber 120 through an exhaust system 240 capable of achieving a low pressure in the cleaning chamber. A throttle valve 245 in the exhaust 240 is used for maintaining a chamber pressure from about 150 mTorr to about 3000 mTorr.

In the version illustrated in FIG. 4, the remote chamber 230 comprises a tube shaped cavity containing at least a portion of the remote plasma zone 225. Flow of cleaning gas into the remote chamber 230 is adjusted by a mass flow controller or gas valve 250. The remote chamber 230 may comprise walls made of a dielectric material such as quartz, aluminum oxide, or monocrystalline sapphire that is substantially transparent to microwaves and is non-reactive to the cleaning gas. A microwave generator 255 is used to couple microwave radiation to the remote plasma zone 225 of the remote chamber 230. A suitable microwave generator 255 is an "ASTEX" Microwave Plasma Generator commercially available from the Applied Science & Technology, Inc., Woburn, Mass. The microwave generator assembly 255 may comprise a microwave applicator 260, a microwave tuning assembly 265, and a magnetron microwave generator 270. The microwave generator may be operated at a power level of about 200 to about 3000 Watts, and at a frequency of about 800 MHz to about 3000 MHz. In one version, the remote plasma zone 225 is sufficiently distant from the process zone 215 to allow recombination of some of the dissociated or ionized gaseous chemical species. The resultant reduced concentration of free electrons and charged species in the activated cleaning gas minimizes charge-up damage to the active devices on the substrate 30, and provides better control of the chemical reactivity of the activated gas formed in the remote plasma zone 225. In one version, the center of the remote plasma zone 225 is maintained at a distance of at least about 50 cm from the center of the process zone 215.

A cleaning process may be performed in the cleaning chamber 120 by exposing the substrate 30 to energized process gas comprising cleaning gas to, for example, remove remnant resist 60 and/or to remove or inactivate etchant residue 70 remaining on the substrate after the substrate is etched. Remnant resist 60 may be removed from the substrate 30 in a stripping (or ashing) process by exposing the substrate 30 to energized process gas comprising stripping gas. Stripping gas may comprise, for example, one or more of $O_2$, $N_2$, $H_2$, $H_2O$, $NH_3$, $CF_4$, $C_2F_6$, $CHF_3$, $C_3H_2F_6$, $C_2H_4F_2$, or $CH_3F$. In one version, a suitable stripping gas for stripping polymeric resist material comprises (i) oxygen, and optionally (ii) an oxygen activating gas or vapor, such as water vapor, nitrogen gas, or fluorocarbon gas, the fluorocarbon gases including any of those listed above. The oxygen activating gas increases the concentration of oxygen radicals in the stripping gas. The stripping gas composition may comprise oxygen and nitrogen in a volumetric flow ratio of about 6:1 to about 200:1, and more preferably from about 10:1 to about 12:1. For a 5-liter process chamber 120, a suitable gas flow rate comprises 3000 to 3500 sccm of $O_2$ and 300 sccm of $N_2$. In one version, a stripping gas comprises about 3500 sccm $O_2$ about 200 sccm $N_2$ and optionally about 300 sccm $H_2O$, that is energized at a power level of about 1400 Watts and introduced into the cleaning chamber 120 at a pressure of about 2 Torr for about 15 seconds. In one version, the water vapor content in the stripping gas should be less than about 20% by volume of the combined oxygen and nitrogen gas content to provide adequate stripping rates. A suitable ratio of the volumetric water vapor flow $V_{H2O}$ to the combined volumetric flow of oxygen and nitrogen ($V_{O2}+V_{N2}$) is from about 1:4 to about 1:40, and more preferably about 1:10. When the remnant resist comprises oxide hard mask, suitable stripping gases are gases capable of stripping oxide, such as halogen containing gases, including $CF_4$, $C_2F_6$, $CHF_3$, $C_3H_2F_6$, $C_2H_4F_2$ and HF. The substrate may be exposed to the stripping gas for a period of time of from about 10 seconds to about 1000 seconds, and more preferably for about 45 seconds. A single stripping step may be performed or multiple stripping steps may be performed, as discussed in U.S. Pat. No. 5,545,289, which is incorporated herein by reference in its entirety.

The cleaning process may also comprise post-etch passivation of the substrate 30, particularly when conductive material 45 has been etched in the etching process, to remove or inactivate corrosive residue species 75 on the substrate 30. To passivate the substrate 30, energized process gas comprising passivating gas may be provided in the process zone 215. The passivating gas composition is selected to remove or inactivate corrosive etchant residue, such as residual species 75 or to prevent the formation of corrosive or contaminant materials on the etched substrate 30. Passivating gas may comprise one or more of $H_2O$, $NH_3$, $H_2O_2$, $O_2$, $N_2$, $CF_4$, $C_2F_6$, $CHF_3$, $H_2$, $C_3H_2F_6$, $C_2H_4F_2$, or $CH_3F$. In one version, any gas or vapor containing hydrogen can serve as the passivating gas, including hydrogen, water vapor, ammonia, methanol, hydrogen sulfide, and mixtures thereof. In another version, the passivating gases include (i) ammonia and oxygen, or (ii) water vapor, with optional oxygen and nitrogen. When the passivating gas comprises ammonia and oxygen, the volumetric flow ratio of ammonia to oxygen is preferably from about 1:1 to about 1:50, more preferably from about 1:5 to about 1:20, and most preferably about 1:10. For a 5-liter capacity chamber 120, a preferred gas flow comprises 300 sccm $NH_3$ and 3000 sccm $O_2$. Alternatively, a passivating gas comprising at least about 80 volume % $H_2O$, and preferably about 100 volume % $H_2O$, can be used to passivate the etchant residue 75. In one version, a passivating gas comprises about 500 sccm $H_2O$ energized at a power level of about 1400 Watts and introduced into the cleaning chamber 120 at a pressure of about 2 Torr for about 15 seconds. When a bubbler is used, an inert carrier gas such as argon or helium can be passed through the bubbler to transport water vapor to the vacuum chamber. Optionally, oxygen, nitrogen or other additive can be added to the passivating gas to enhance passivating. In this version, the passivating gas comprises at least about 20 volume % $H_2O$. The effect of the oxygen and nitrogen addition depends on the ratio of the volumetric flow rate of water vapor ($V_{H2O}$) to the combined volumetric flow rates of oxygen and nitrogen ($V_{O2}+V_{N2}$). A suitable volumetric ratio of water vapor flow rate $V_{H2O}$ to combined volumetric flow rates of oxygen and nitrogen ($V_{O2}+V_{N2}$) for use as a passivating gas is at least about 1:2, more preferably from about 1:2 to about 2:1, and most preferably about 1:1. As with the stripping process and as discussed in U.S. Pat. No. 5,545,289, the passivation may be either a single step or multiple steps. In one version, the substrate is exposed to the passivating gas for a period of time of from about 10 seconds to about 100 seconds, and more preferably for about 45 seconds. In one version, a multi-cycle passivation process, for example a three cycle process, has been discovered to be particularly effective in preventing corrosion.

In one version, the substrate may be heated during the stripping and/or the passivation processes. For example, when cleaning the substrate 30 in a cleaning chamber 120, such as the cleaning chamber of FIG. 4, the lamps 220 may be used to heat the substrate to a temperature of at least about 150° C., and even at least about 200° C., and preferably to a temperature of at least about 250° C. Heating the substrate 30 improves the remnant resist removal rate and may also improve the removal rate of some etchant residue, such as Cl in the sidewall deposits 80, because the Cl can more readily diffuse out of the sidewall deposits. The elevated temperatures also enhance the surface oxidation, when $O_2$-containing strip density is used, of the etched metal, making them less susceptible to corrosion.

After the substrate 30 is stripped and passivated, the substrate 30 may be transferred to a wet-cleaning chamber (not shown) where the substrate 30 may be exposed for a short period to a solvent to complete the removal of remnant resist 60 and etchant residue 70. By first cleaning the substrate 30 in the cleaning chamber, the solvent exposure time and/or the solvent strength may be minimized thereby reducing the deleterious effects of the solvent, such as attack of the etched features 67 which may result in sidewall etching and/or critical dimension loss. In some substrate processes, such as those using a thin resist material 60 or those using lightly polymerizing etchant chemistries, the need for exposing the substrate 30 to a wet solvent, such as for example EKC Z65 or similar solvents from EKC Technology, Inc. in Hayward, Calif., to complete the removal of remnant resist 60 or polymeric sidewall deposits 80, may be eliminated or replaced by a de-ionized water rinse, significantly improving the substrate fabrication process by substantially preventing damage to the etched features 67 that may otherwise occur in the presence of the wet solvent and by reducing the costs and environmental impact of the process.

It has been discovered that the removal of remnant resist 60 or etchant residue 70 can be improved by exposing the substrate to a process gas comprising a treating gas before, during, or after the cleaning process. The treating gas may be selected to enhance or improve the cleaning of the substrate thereby further reducing the need to expose the substrate 30 to a wet solvent after a cleaning process. The treating process may be performed in the etching chamber 110, in the cleaning chamber 120, or in a separate chamber. In one version the treating gas comprises a halogen. In one particular version, the treating gas comprises a hydrogen species and a halogen species. For example, the treating gas may comprise one or more of HCl, HBr, and HF. Alternatively, the treating gas may comprise $H_2$ and one or more of $Cl_2$, $Br_2$, and $F_2$, or any composition that provides a hydrogen species, such as one or more of $NH_3$, $CHF_3$, $CH_2F_2$, $CH_3F$ or $H_2$, $H_2O$ and equivalents, and a halogen species, such as one or more of HCl, HBr, HF, $Cl_2$, $Br_2$, $F_2$, $CF_4$, $NF_3$, $SF_6$, $CHF_3$, $C_2F_6$, $CH_2F_3$, $CH_3F$ and, and equivalents.

Figure 5A:
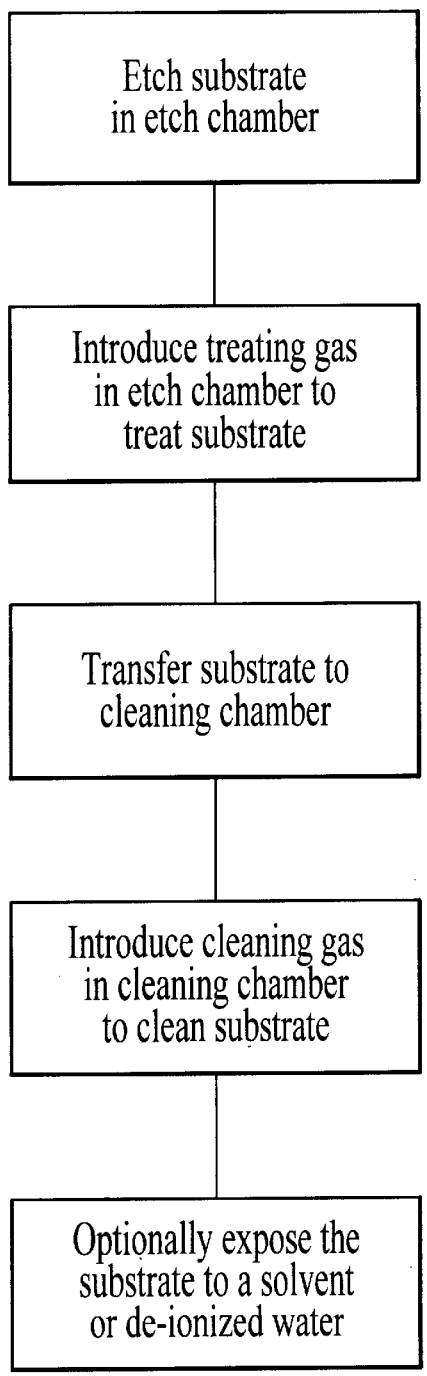
FIGS. 5a and 5b are flow charts illustrating substrate cleaning processes.
Figure 5B:
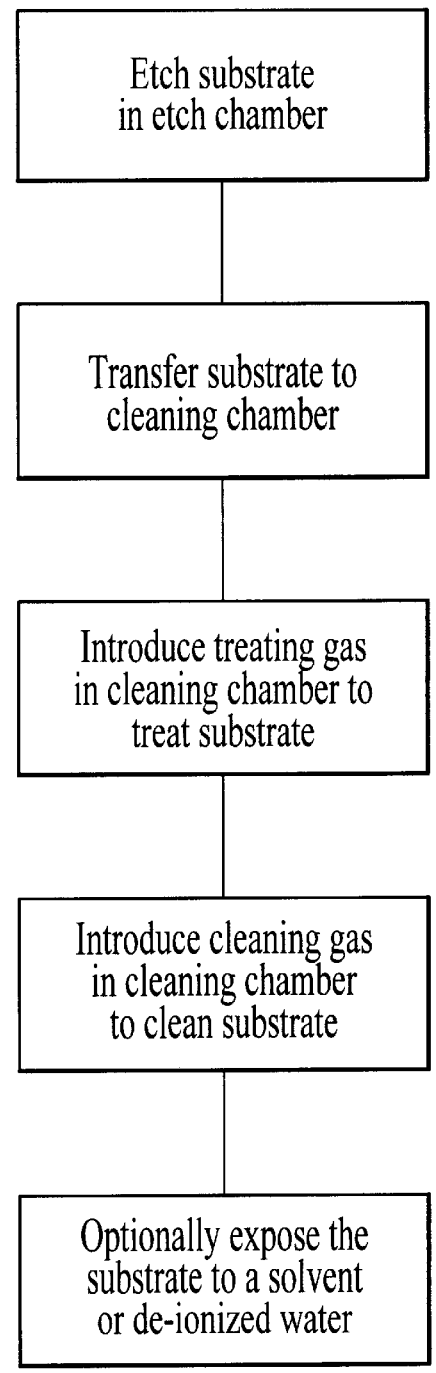

In one version, as illustrated in FIGS. 5a and 5b, the substrate 30 may be pre-treated prior to cleaning by exposing the etched substrate 30 to an energized process gas comprising treating gas. As shown in FIG. 5a, the treating gas may be provided in the etching chamber 110 before the substrate 30 is transferred to the cleaning chamber 120. Alternatively, as shown in FIG. 5b, the substrate 30 may be treated in the cleaning chamber 120. In another version, the etching, treating, and cleaning processes are all performed in the same chamber. In the FIG. 5a version, after or just before an etching process has been completed on the substrate 30 or on a layer on the substrate 30, an energized process gas comprising treating gas is provided in the process zone 145 of the etching chamber 110. In the FIG. 5b version, an energized process gas comprising treating gas is provided in the process zone 215 of the cleaning chamber 120. After completion of the treating process or during the treating process, cleaning gas is provided in the process zone 215 to remove the remnant resist 60 and/or to remove the etchant residue 70 from the substrate 30.

It has been discovered that an effective treating gas, particularly when treating the substrate 30 as shown in FIG. 5a, comprises chlorine species, and in one version comprises a hydrogen species and a chlorine species. Accordingly, in one version of the invention, the substrate 30 may be exposed to an energized process gas comprising one or more of (i) HCl, (ii) $H_2$ and $Cl_2$, and (iii) a hydrogen species containing gas and a chlorine species containing gas. Treating gas comprising a hydrogen species and a chlorine species is effective in at least partially removing sidewall deposits 80, such as polymeric sidewall deposits, on the substrate 30. By treating the substrate 30 with the treating gas and by cleaning the substrate 30 with the cleaning gas, it has been shown that sufficient etchant residue 70 is removed to significantly reduce or eliminate the need to expose the substrate to a wet solvent or to a wet solvent other than $H_2O$. The hydrogen species and chlorine species containing treating gas is also particularly effective in removing or in aiding in the removal of sidewall deposits 80 on etched features 67 having tapered profiles. It is believed that treating gas comprising HCl or $H_2/Cl_2$ reacts with sidewall deposits 80 to remove them from the etched features 67. For example, the chlorine species may react with metal species, such as aluminum, and hydrogen species may react with organic components, such as carbon. In one version, it has been shown to be advantageous to combine a pretreatment process and a passivation process in order to significantly improve corrosion prevention.

Figures 6A, 6B:
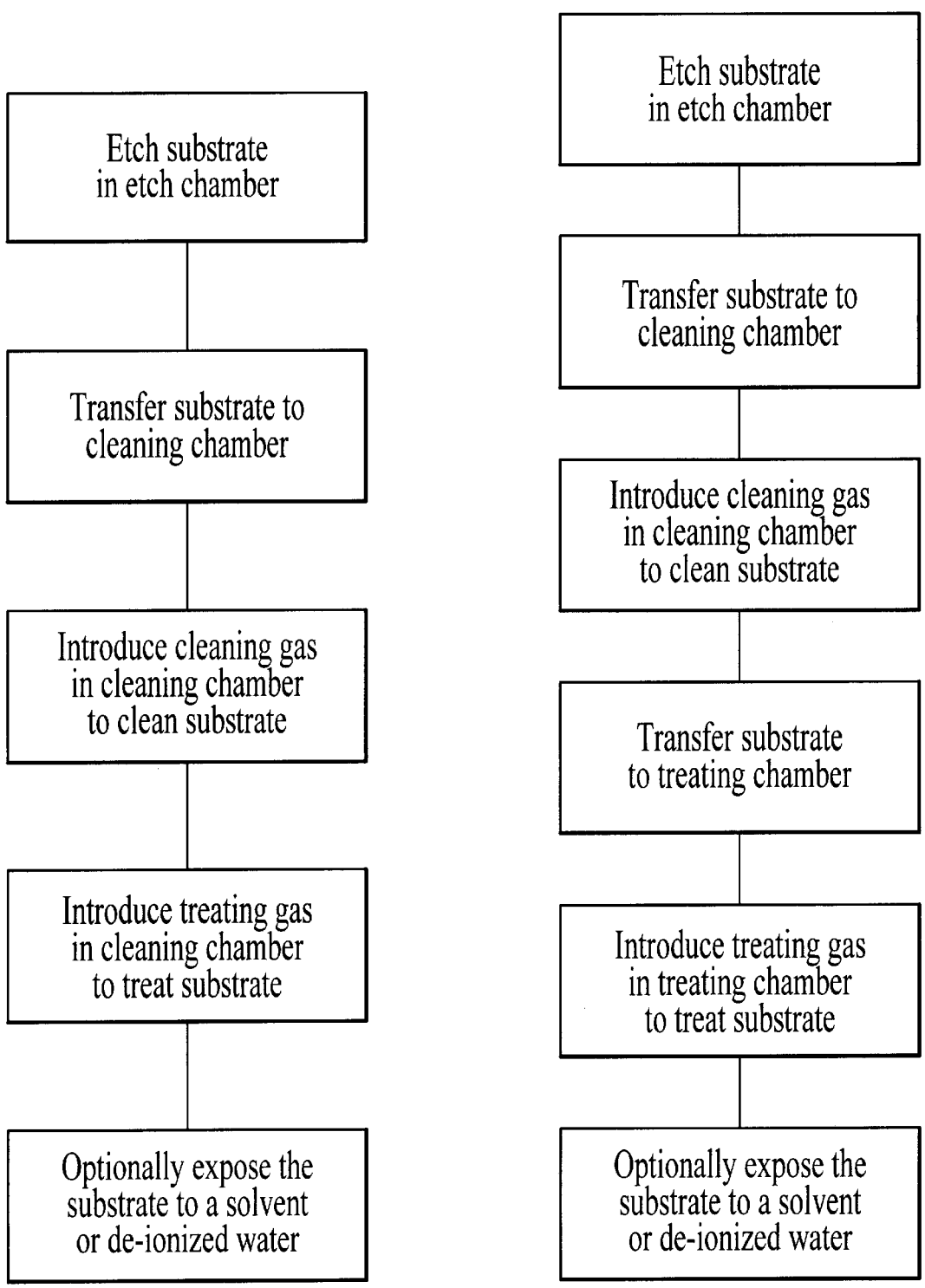
FIGS. 6a and 6b are flow charts illustrating other versions of substrate cleaning processes.

Another version of the invention is shown in FIGS. 6a and 6b. In this version, the substrate 30 is exposed to an energized process gas comprising treating gas after a cleaning process. In the version of FIG. 6a, the treating process may be performed in the cleaning chamber 120 after the cleaning process. The treating gas may be provided in the process zone 215 of the cleaning chamber 120 before or after completion of the cleaning process. Alternatively, as shown in FIG. 6b, the substrate 30 may be transferred to a treating chamber, such as a second cleaning chamber 120, where it can be treated. In the versions of FIGS. 6a and 6b, the treating gas may be selected to remove remnant resist 60 or etchant residue 70 that remains on the substrate 30 after the cleaning process or may soften and/or loosen the remaining resist 60 or etchant residue 70 so that it may be removed in a deionized water bath or with a shortened exposure to a wet solvent.

It has been discovered that a treating gas comprising fluorine is effective in treating the substrate 30 by, for example, softening or loosening remaining etchant residue 70 on the substrate 30 after a cleaning process. For example, a treating gas comprising a hydrogen species, such as one or more of $NH_3$, $H_2O$, $H_2$ and a fluorine species, such as $NF_3$, $CF_4$, $F_2$, $SF_6$, $C_2F_6$, and $CHF_3$, has been shown to effectively remove and/or soften polymeric resist and residue on the substrate 30. In one version, a treating gas comprising $NH_3$ and a fluorine-containing gas, such as one or more of $NF_3$, $CF_4$, has been shown to allow for effective etchant residue 70 removal without the need for exposing the substrate 30 to a wet solvent. It is believed that by energizing the $NH_3$ and the fluorine-containing gas, hydrogen and fluorine species are generated that react with and solubilize the sidewall deposits 80, to render the deposits removable by a de-ionized water rinse, for example. In addition, it is believed that a particular mixture of $NH_3$ and $NF_3$, such as for example 3:1 $NH_3$ to $NF_3$, can produce a film on the substrate 30 that may release HF when exposed to an aqueous solution or other polar solvent. Accordingly, HF can be liberated and residue removed simultaneously during the wet process steps (e.g. DI rinse).

An advantage of the version of FIG. 6a is that the treating gas may also be introduced under process conditions selected to remove process residue from the chamber surfaces, such as surfaces of walls or components in the chamber 120. For example, residue may be generated during the cleaning process, and the residue may get deposited on the surfaces. By simultaneously treating the substrate 30 and removing the residue from the surfaces in the chamber 120, the need for a separate chamber cleaning step may be reduced, and throughput and substrate fabrication consistency may be improved. Thus, in one version, a halogen-containing treating gas is introduced in the process zone 215 of the cleaning chamber 120 after or during a cleaning process to simultaneously treat the substrate 30 and to remove residue from the chamber surfaces. The treating gas may be introduced in a volumetric flow rate of about 80 sccm to about 1000 sccm, more preferably about 300 sccm to about 500 sccm, and most preferably about 320 sccm, under the following process conditions: 80 sccm $NF_3$, 240 sccm $NH_2$, 2 torr, 1.4 kw for 200 mm substrate processing chamber. In one particular version, the treating gas may comprise one or more of $H_2$, $F_2$, $NH_3$, $NF_3$, $CF_4$, $CH_4$, $CH_3F$, and $CHF_3$. The treating gas may also be used to clean residue from the chamber surfaces in a version of the invention where the substrate 30 is etched, cleaned, and treated in the same chamber, thereby removing etchant residue and/or cleaning residue from the chamber surfaces. For example, treatment in the etch chamber using HCl or $H_2/Cl_2$ can remove etchant residues from the wafer and etch by-product deposition from chamber surfaces.

The effectiveness of the treating gas in the processes of FIGS. 5a and 5b or FIG. 6a or 6b may be increased by selecting process conditions that maximally treat the substrate 30 without damaging the etched features 67 thereon. For example, in the version of FIGS. 5a and 5b, the treating gas may comprise HCl in a volumetric flow rate of from about 80 sccm to about 250 sccm, more preferably from about 100 sccm to about 200 sccm, and most preferably about 150 sccm in the etching chamber 110 or in equivalent volumetric flow rates in the cleaning chamber 120, for 200 mm substrate processing chamber. The substrate 30 may be exposed to the treating gas for a period of at least about 30 seconds, more preferably at least about 120 seconds, and most preferably about 240 seconds with the chamber 110 maintained at a pressure of about 25 mTorr, a source power of about 500 watts, and a temperature of about 150° C. In the version of FIGS. 6a and 6b, the treating gas may comprise $NH_3$ in a volumetric flow rate of from about 80 sccm to about 1000 sccm, more preferably from about 100 sccm to about 400 sccm, and most preferably about 240 sccm and $NF_3$ in a volumetric flow rate of from about 5 sccm to about 200 sccm, more preferably from about 20 sccm to about 120 sccm, and most preferably about 80 sccm in the cleaning chamber 120. The volumetric flow ratio of $NH_3$ to $NF_3$ may be from about 1:1 to about 10:1, more preferably from about 2:1 to about 4:1, most preferably 3:1.

The effectiveness of the treating gas may also be increased by applying a bias to the substrate 30. For example, in the version of FIGS. 5a and 5b, a bias power of from about 0 watts to about 150 watts, more preferably from about 20 watts to about 100 watts, and most preferably about 50 watts may be applied to the process electrode 175 in the etching chamber 110. The application of bias power has been shown by scanning electron microscope (SEM) data to significantly improve the resist material 60 and the etchant residue 70 removal during the treating process, leaving less resist 60 and residue 70 to be removed during the cleaning process. It is believed that the ion flux resulting from the applied bias power together with the reaction of the treating gas with sidewall deposits 80 helps to remove the sidewall deposits 80 from the etched features 67. Bias power may also increase the effectiveness of the treating process of FIGS. 6a and 6b and may be, for example, from about 0 to 600 watts, more preferably from about 50 watts to about 300 watts, and most preferably about 150 watts.

The temperature of the substrate 30 may also be selected to increase the effectiveness of the cleaning and the treating processes. For example, in the treating process of FIGS. 6a and 6b, it has been determined that a substrate temperature of from about 20° C. to about 100° C. is effective in treating the substrate 30, for example by solubilizing the sidewall deposits 80. This is believed to be due to enhancing adsorption of the reactive species onto the substrate and minimizing chemical attack of the substrate. Accordingly, in one version of the invention, the substrate 30 is maintained at a temperature of from about 20° C. to about 100° C. In one particular version, the substrate is cleaned in a stripping and passivating process at a temperature of about 250° C. and then cooled to a temperature of about 50° C. to about 100° C. to treat the substrate. When the substrate 30 is cleaned and treated in the same chamber, for example as shown in FIG. 6a, the substrate may be rapidly cooled, such as by circulating a heat transfer fluid through the support 210 in the chamber. Alternatively, when different chambers are used, for example as shown in FIG. 6b, one chamber may be maintained at a first temperature, such as about 250° C., and the second chamber may be maintained at a second temperature, such as from about 30° C. to about 100° C. By providing two chambers at different temperatures or by rapidly cooling the substrate 30, process throughput may be increased, as discussed in commonly owned U.S. patent application Ser. No. 09/595,336, filed on Jun. 14, 2000, entitled "Substrate Cleaning Apparatus and Method" by Yun et al, attorney docket number 3148/USA/EMET, which is incorporated herein by reference in its entirety.

The integrated process sequence of the versions described above provides effective and improved remnant resist 60 and etchant residue 70 removal. The cleaned substrate often does not require wet solvent exposure. The versions of FIGS. 5a, 5b, 6a, and 6b provide a large process window for etch processes by providing improved strip/residue removal. The invention allows for the removal of resist 60 and residue 70 at relatively low temperatures with a de-ionized water rinse following exposure of the substrate 30 to to relatively high temperature oxygen-containing and/or water vapor containing gases. This is advantageous because the high temperature provides high strip rates and improved corrosion control. In addition, the invention provides the ability to incorporate additional processes, such as high temperature nitrogen exposure, which can improve corrosion resistance, but which necessitates wet solvent exposure of the substrate 30 in conventional processes.

Figures 7A, 7B:
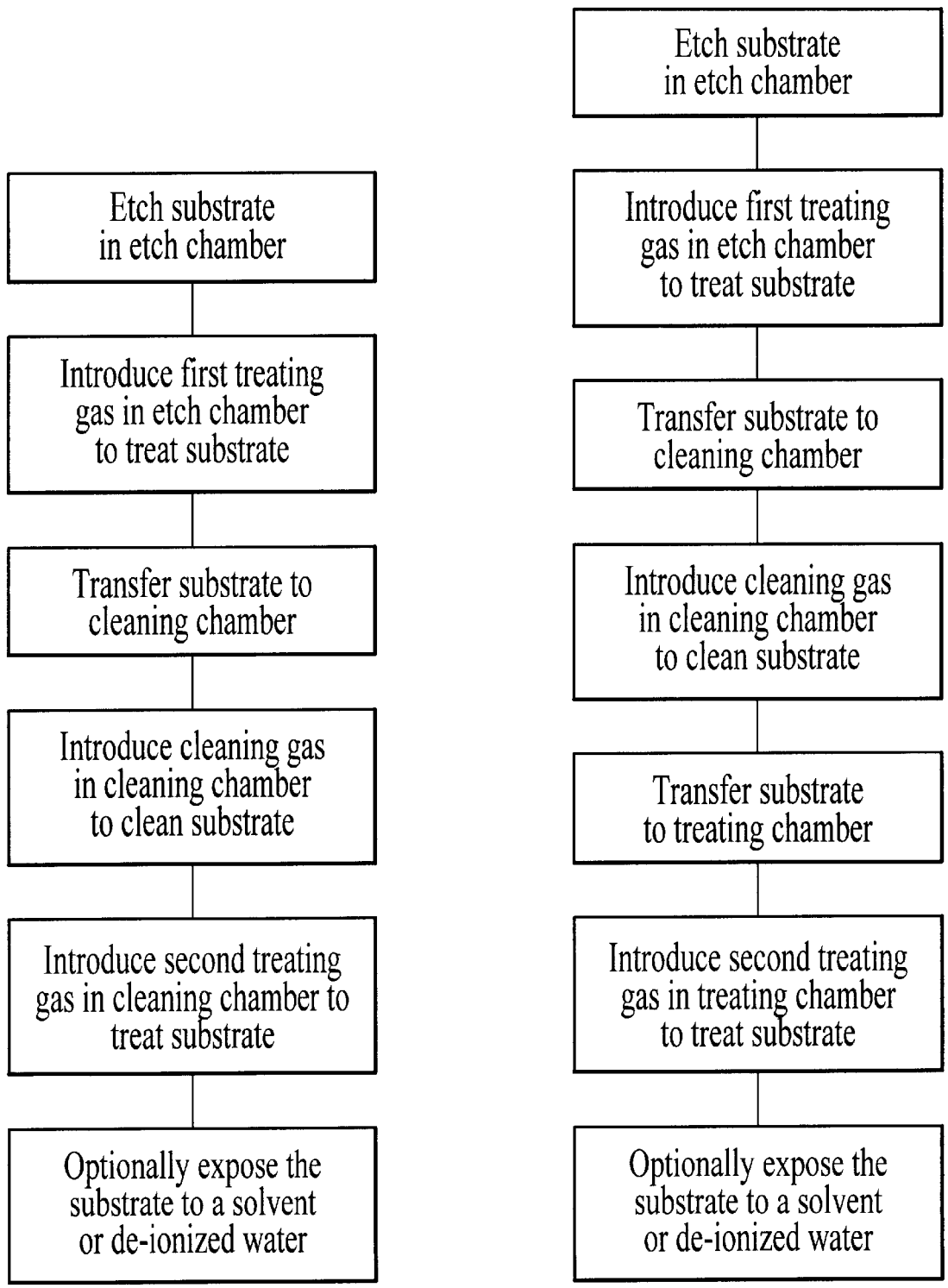
FIGS. 7a–7c are flow charts illustrating other versions of substrate cleaning processes.
Figure 7C:
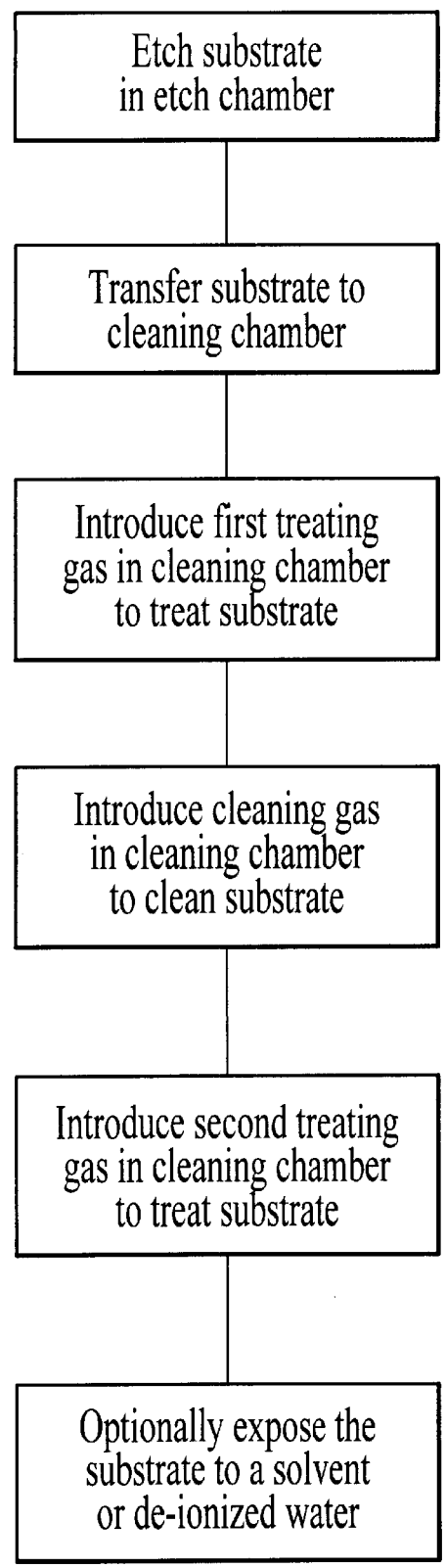

In another version, as shown in FIGS. 7a, 7b, and 7c, the substrate 30 may be exposed to an energized process gas comprising a first treating gas before a cleaning process and exposed to an energized process gas comprising a second treating gas after the cleaning process. This version provides increased removal of resist 60 and etchant residue 70 and even further reduces the need to expose the substrate 60 to a wet solvent. The first and second treating gases may be the same gas or different gas. In one version, one of the treating gases may comprise chlorine. In another version, one of the treating gases may comprise fluorine. In one particular version, the first treating gas comprises a hydrogen species and a chlorine species, such as HCl, and the second treating gas comprises a hydrogen species and a fluorine species, such as one or more of $NH_3$ and $H_2$ and one or more of $NF_3$, $CF_4$, and $SF_6$. As shown in FIG. 7a, the first treating gas may be introduced in the etching chamber 110 after or during an etching process, and the second treating gas may be introduced in the cleaning chamber after or during a cleaning process. In FIG. 7b, the cleaning process and the second treating process are performed in separate chambers. In the version of FIG. 7c, the first and second treating gases are provided in the cleaning chamber. Alternatively, the etching, cleaning and first and second treating processes may be performed in the same chamber.

Although the present invention has been described in considerable detail with regard to the preferred embodiments thereof, other embodiments are possible. For example, the order of stripping and passivating and treating may be changed. Additionally, a treating gas comprising fluorine may be introduced before the cleaning process. Other similar modifications can be made without departing from the scope of the invention. Therefore, the appended claims should not be limited to the descriptions of the preferred embodiments contained herein.

What is claimed is:

1. A substrate processing method comprising:
   (a) exposing a substrate to an energized process gas to etch a pattern of features on the substrate;
   (b) after (a), exposing the substrate to an energized cleaning gas; and
   (c) after (b), exposing the substrate to an energized treating gas formed from treating gas comprising HCl.

2. A method according to claim 1 wherein the cleaning gas comprises a stripping gas comprising one or more of $O_2$, $N_2$, $H_2O$, $NH_3$, $CF_4$, $C_2F_6$, $CHF_3$, $C_3H_2F_6$, $C_2H_4F_2$, and $CH_3F$, provided under process conditions selected to at least partially remove remnant resist material on the substrate.

3. A method according to claim 1 wherein the cleaning gas comprises a passivating gas comprising one or more of $H_2O$, $NH_3$, $H_2O_2$, $O_2$, $N_2$, $CF_4$, $C_2F_6$, $CHF_3$, $C_3H_2F_6$, $C_2H_4F_2$, or $CH_3F$, provided under process conditions selected to passivate the substrate.

4. A method according to claim 1 wherein the treating gas comprises a fluorine species.

5. A method according to claim 1 wherein the treating gas comprises one or more of $NH_3$ and $H_2$.

6. A method according to claim 5 wherein the treating gas comprises one or more of $NF_3$, $CF_4$, $C_2F_6$ and $SF_6$.

7. A method according to claim 1 wherein the treating gas comprises one or more of HBr and HF.

8. A method according to claim 1 wherein the treating gas comprises $H_2$ and one or more of $Cl_2$, $Br_2$ and $F_2$.

9. A method according to claim 1 wherein the treating gas comprises one or more of (i) $H_2O$, (ii) $H_2O_2$, (iii) $H_2$ and $O_2$, and (iv) $H_2$ and $H_2O$.

10. A method according to claim 1 wherein the substrate is exposed to the etching gas in a first process zone and wherein the substrate is exposed to the cleaning gas in a second process zone.

11. A method according to claim 10 wherein the substrate is exposed to the treating gas in the first process zone.

12. A method according to claim 10 wherein the substrate is exposed to the treating gas in the second process zone.

13. A method according to claim 1 wherein (c) comprises coupling RF or microwave energy to the treating gas to form the energized treating gas.

14. A method according to claim 1 wherein the treating gas consists essentially of HCl.

15. A substrate processing method comprising:
   (a) exposing a substrate to an energized process gas in a first process zone to etch a pattern of features on the substrate;
   (b) after (a), exposing the substrate to an energized cleaning gas in a second process zone; and
   (c) after (a) and before (b), exposing the substrate to an energized treating gas comprising a chlorine species in the first process zone.

16. A method according to claim 15 wherein the treating gas is provided under process conditions selected to enhance removal of etchant residue or remnant resist on the substrate.

17. A method according to claim 15 wherein the treating gas comprises a hydrogen species.

18. A method according to claim 17 wherein the treating gas comprises HCl.

19. A method according to claim 17 wherein the treating gas comprises $H_2$ and $Cl_2$.

20. A substrate processing method comprising:
   (a) exposing a substrate to an energized process gas to etch a pattern of features on the substrate;
   (b) after (a), exposing the substrate to an energized cleaning gas; and
   (c) after (a) and before or after (b), coupling RF or microwave energy to a treating gas in a remote zone to form an energized treating gas, the treating gas comprising (i) a fluorine species and (ii) a hydrogen species comprising one or more of $H_2O$, $H_2$ and $NH_3$; introducing the energized treating gas into a process zone and exposing the substrate to the energized treating gas in the process zone.

21. A method according to claim 20 wherein the treating gas is provided under process conditions selected to enhance removal of etchant residue or remnant resist on the substrate.

22. A method according to claim 20 wherein (c) occurs after (b).

23. A method according to claim 20 wherein (b) and (c) are performed in the same process zone.

24. A method according to claim 20 wherein the treating gas comprises $H_2$ and $F_2$.

25. A method according to claim 20 wherein the treating gas comprises one or more of $NF_3$, $CF_4$, $C_2F_6$, and $SF_6$.

26. A method of treating a substrate, the method comprising:
   (a) exposing a substrate to an energized process gas to etch a pattern of features on the substrate;

(b) exposing the etched substrate to a first energized treating gas comprising chlorine species in a first process zone; and (c) after (b), exposing the etched substrate to a second energized treating gas comprising fluorine species in a second process zone.

27. A method according to claim 26 wherein the chlorine species comprises one or more of HCl and $Cl_2$.

28. A method according to claim 26 wherein the fluorine species comprises one or more of $NF_3$, $CF_4$, $C_2F_6$, and $SF_6$.

29. A method of cleaning a substrate, the method comprising:

(a) exposing a substrate to an energized process gas to etch a pattern of features on the substrate;

(b) exposing the substrate to a cleaning gas; and (c) after (b), exposing the substrate to an energized treating gas, the treating gas comprising a fluorine species and $NH_3$.

30. A method according to claim 29 wherein the treating gas comprises one or more of $NF_3$, $CF_4$, $C_2F_6$, and $SF_6$.

31. A method according to claim 29 wherein the cleaning gas comprises a stripping gas comprising one or more of $O_2$, $N_2$, $H_2O$, $NH_3$, $CF_4$, $C_2F_6$, $CHF_3$, $C_3H_2F_6$, $C_2H_4F_2$, and $CH_3F$, provided under process conditions selected to at least partially remove remnant resist material on the substrate.

32. A method according to claim 29 wherein the cleaning gas comprises a passivating gas comprising one or more of $H_2O$, $NH_3$, $H_2$, $H_2O_2$, $O_2$, $N_2$, $CF_4$, $C_2F_6$, $CHF_3$, $C_3H_2F_6$, $C_2H_4F_2$, or $CH_3F$, provided under process conditions selected to passivate the substrate.

33. A method according to claim 29 wherein the treating gas consists essentially of $NF_3$ and $NH_3$.

34. A substrate processing method comprising:

(a) exposing a substrate to an energized process gas to etch a pattern of features on the substrate in a process zone;

(b) after etching of the substrate is completed, exposing the substrate to an energized treating gas in the process zone while maintaining a bias power level applied to the substrate of from about 20 to about 100 watts, the energized treating gas comprising chlorine species; and (c) after (b), exposing the substrate to an energized cleaning gas.

35. A method according to claim 34 wherein the treating gas comprises a hydrogen species.

36. A method according to claim 35 wherein the treating gas comprises HCl.

37. A method according to claim 35 wherein the treating gas comprises $H_2$ and $Cl_2$.

38. A method according to claim 34 further comprising exposing the substrate to the energized cleaning gas in a second process zone.

39. A method of treating a substrate, the method comprising:

(a) exposing a substrate to an energized process gas to etch a pattern of features on the substrate;

(b) exposing the etched substrate to an energized process gas comprising oxygen species while maintaining the substrate at a temperature of at least about 200° C.;

(c) before or after (b), treating the substrate with a treating gas; and (d) performing the step of rinsing the substrate with de-ionized water to remove etchant residue on the substrate without rinsing the substrate in another solvent.

40. A method according to claim 39 wherein (c) comprises exposing the substrate to an energized treating gas.

41. A method according to claim 39 wherein the treating gas comprises a halogen species.

42. A method according to claim 39 wherein the treating gas comprises a halogen species and a hydrogen species.

43. A method according to claim 39 wherein the treating gas comprises $NH_3$ and one or more of $NF_3$, $CF_4$, $C_2F_6$, and $SF_6$.

44. A method according to claim 39 wherein in (c), the substrate is maintained at a temperature of from about 20° C. to about 100° C.

45. A substrate processing method comprising:

(a) exposing a substrate to an energized process gas to etch a pattern of features on the substrate;

(b) after (a), exposing the substrate to a first energized treating gas comprising HCl;

(c) after (b), exposing the substrate to an energized cleaning gas comprising one or more of $H_2O$, $NH_3$, $H_2O_2$, $O_2$, $N_2$, $CF_4$, $C_2F_6$, $CHF_3$, $C_3H_2F_6$, $C_2H_4F_2$, and $CH_3F$; and (d) after (c), exposing the substrate to a second energized treating gas comprising $NH_3$ and $NF_3$.

46. A method according to claim 45 wherein (b) comprises exposing the substrate to a first energized treating gas comprising HCl in a volumetric flow rate of from about 80 sccm to about 250 sccm.

47. A method according to claim 45 wherein (d) comprises exposing the substrate to a second energized treating gas comprising (i) $NH_3$ in a volumetric flow rate of from about 80 to about 1000 sccm, and (ii) $NF_3$ in a volumetric flow rate of from about 5 to about 200 sccm.

48. A method according to claim 45 wherein (c) comprises maintaining the substrate at a temperature of at least about 200° C., and wherein (d) comprises maintaining the substrate at a temperature of from about 20° C. to about 100° C.

49. A method according to claim 45 wherein (b) comprises maintaining a bias power applied to the substrate of from about 20 to about 100 watts, and wherein (d) comprises maintaining a bias power applied to the substrate of from about 50 to about 300 watts.

* * * * *